United States Patent
Saito (12)

(10) Patent No.: US 11,751,479 B2
(45) Date of Patent: Sep. 5, 2023

(54) METHOD FOR CONTROLLING PIEZOELECTRIC DRIVING APPARATUS, PIEZOELECTRIC DRIVING APPARATUS, AND ROBOT

(71) Applicant: SEIKO EPSON CORPORATION, Tokyo (JP)

(72) Inventor: Hidetoshi Saito, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 472 days.

(21) Appl. No.: 17/126,048

(22) Filed: Dec. 18, 2020

(65) Prior Publication Data

US 2021/0193902 A1    Jun. 24, 2021

(30) Foreign Application Priority Data

Dec. 20, 2019    (JP) .................................. 2019-230206

(51) Int. Cl.
   *H02N 2/00*     (2006.01)
   *H10N 30/20*    (2023.01)
   *B25J 9/12*     (2006.01)
   *H10N 30/80*    (2023.01)

(52) U.S. Cl.
   CPC .......... *H10N 30/2023* (2023.02); *B25J 9/123* (2013.01); *H10N 30/802* (2023.02)

(58) Field of Classification Search
   CPC .. H10N 30/2023; H10N 30/802; H02N 2/004; H02N 2/008; H02N 2/14; H02N 2/103; H02N 2/02; H02N 2/04; H02N 2/062; B25J 9/123; B25J 9/12
   See application file for complete search history.

(56) References Cited

U.S. PATENT DOCUMENTS 11,482,661 B2 *  10/2022  Kajino .................. H02N 2/026
2008/0150393 A1   6/2008  Funakubo

FOREIGN PATENT DOCUMENTS

| JP | H1118456 A | 1/1999 |
| JP | 2007074829 A | 3/2007 |
| JP | 2008160913 A | 7/2008 |

\* cited by examiner

*Primary Examiner* — Emily P Pham
(74) *Attorney, Agent, or Firm* — Gang Yu

(57) ABSTRACT

A piezoelectric vibrator has a first frequency region where the phase difference between a pickup signal representing the vibration of the piezoelectric vibrator and a drive signal that drives the piezoelectric vibrator does not monotonously change in accordance with the frequency of the drive signal and a second frequency region where the phase difference monotonously changes in accordance with the frequency of the drive signal. A method for controlling a piezoelectric driving apparatus including the piezoelectric vibrator controls the frequency of the drive signal in such a way that pickup voltage representing the amplitude of the pickup signal is fixed in the first frequency region and controls the frequency of the drive signal in such a way the pickup voltage is fixed with the phase difference maintained smaller than or equal to a prespecified value in the second frequency region.

6 Claims, 7 Drawing Sheets

METHOD FOR CONTROLLING PIEZOELECTRIC DRIVING APPARATUS, PIEZOELECTRIC DRIVING APPARATUS, AND ROBOT

The present application is based on, and claims priority from JP Application Serial Number 2019-230206, filed Dec. 20, 2019, the disclosure of which is hereby incorporated by reference herein in its entirety.

BACKGROUND

1. Technical Field

The present disclosure relates to a method for controlling a piezoelectric driving apparatus, the piezoelectric driving apparatus, and a robot.

2. Related Art

As for a method for controlling a piezoelectric driving apparatus, for example, JP-A-2008-160913 discloses a method for controlling an ultrasonic motor formed of a vibrator and an annular rotor. JP-A-2008-160913 discloses a control method using a phase different between a vibration detection signal detected from the driven vibrator and a drive control signal that drives the vibrator. In the control method described in JP-A-2008-160913, the frequency at which the vibrator is driven is so controlled that the phase difference is a predetermined value when the vibrator is driven.

Depending on the frequency region within which the vibrator is driven, however, no stable vibration detection signal is generated, and it is therefore difficult to detect the phase difference, resulting in possible inappropriate control of the driving frequency.

SUMMARY

According to a first aspect of the present disclosure, a method for controlling a piezoelectric driving apparatus including a piezoelectric vibrator is provided. The piezoelectric vibrator has a first frequency region where a phase difference between a pickup signal representing vibration of the piezoelectric vibrator and a drive signal that drives the piezoelectric vibrator does not monotonously change in accordance with a frequency of the drive signal and a second frequency region where the phase difference monotonously changes in accordance with the frequency of the drive signal, and the method controls the frequency of the drive signal in such a way that pickup voltage representing an amplitude of the pickup signal is fixed in the first frequency region and controls the frequency of the drive signal in such a way the pickup voltage is fixed with the phase difference maintained smaller than or equal to a prespecified value in the second frequency region.

According to a second aspect of the present disclosure, a piezoelectric driving apparatus that drives a driven section is provided. The piezoelectric driving apparatus includes a piezoelectric vibrator that drives the driven section and a controller. The piezoelectric vibrator has a first frequency region where a phase difference between a pickup signal representing vibration of the piezoelectric vibrator and a drive signal that drives the piezoelectric vibrator does not monotonously change in accordance with a frequency of the drive signal and a second frequency region where the phase difference monotonously changes in accordance with the frequency of the drive signal. The controller controls the frequency of the drive signal in such a way that pickup voltage representing an amplitude of the pickup signal is fixed in the first frequency region and controls the frequency of the drive signal in such a way the pickup voltage is fixed with the phase difference maintained smaller than or equal to a prespecified value in the second frequency region.

According to a third aspect of the present disclosure, a robot including the piezoelectric driving apparatus in the second aspect described above is provided.

DESCRIPTION OF EXEMPLARY EMBODIMENTS

A. First Embodiment

Figure 1:
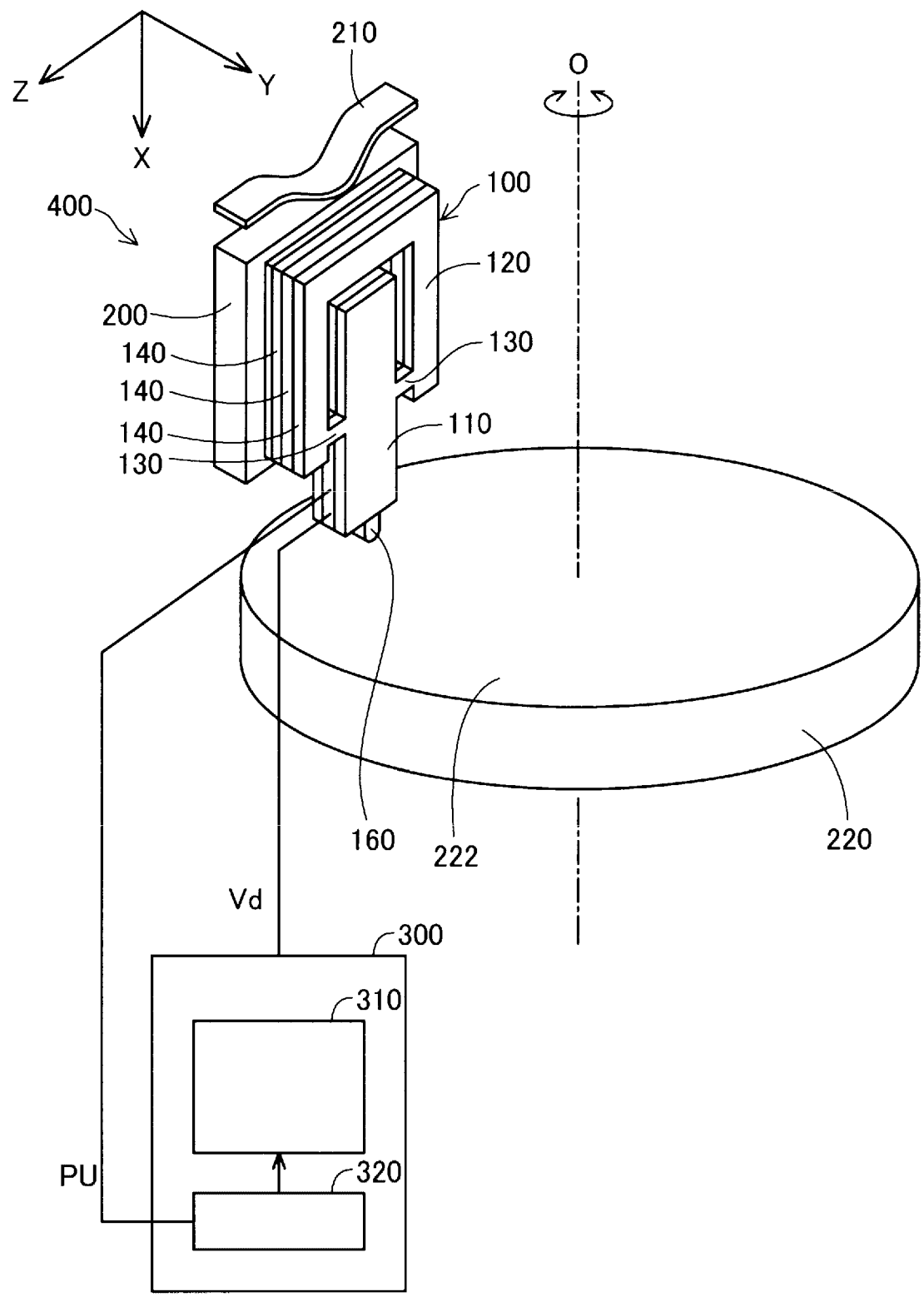
FIG. 1 is a perspective view showing a driving mechanism including a piezoelectric driving apparatus according to a first embodiment.

FIG. 1 is a perspective view showing a driving mechanism including a piezoelectric driving apparatus 400 according to a first embodiment. The piezoelectric driving apparatus 400 includes a piezoelectric vibrator 100, which drives a driven section 220, and a controller 300, which electrically drives the piezoelectric vibrator 100. FIG. 1 shows as the driven section 220 a rotor rotatable around an axis of rotation O. In place of the rotor, another type of member, such as a linearly movable member, can be used as the driven section 220. The piezoelectric vibrator 100 may be formed of a plurality of piezoelectric vibrators 100 per driven section 220.

The piezoelectric vibrator 100 includes a vibrating section 110, which can vibrate, a support 120, which supports the vibrating section 110, and a pair of coupling sections 130, which couple the vibrating section 110 to the support 120. The vibrating section 110 has the shape of a substantially oblong plate. A contactor 160, which is contactable with the driven section 220, is provided at the tip of the vibrating section 110. The contactor 160 is made, for example, of a ceramic material that excels in wear resistance and glued to the vibrating section 110.

The support 120 of the piezoelectric vibrator 100 has a U-letter-like shape that surrounds a portion of the vibrating section 110 that is the portion opposite the contactor 160. The support 120 is fixed to a stage 200 as a support member. The stage 200 is pressed by a spring member 210 toward the driven section 220. A structural element that fixes the spring member 210 is not shown.

The tip of the contactor 160 is in contact with a surface 222 of the driven section 220. The piezoelectric vibrator 100 is pressed by the spring member 210 toward the driven section 220, so that the contactor 160 is in contact with the surface 222 of the driven section 220 with sufficient frictional force created therebetween. The frictional force therefore suppresses a slip between the contact terminal 160 and surface 222, whereby the vibration of the vibrating section 110 can be efficiently transmitted to the driven section 220 via the contactor 160.

In the following description, the lengthwise direction of the vibrating section 110 that is the direction in which the vibrating section 110 and the driven section 220 are arranged is called an "X-axis direction" for convenience of the description. A +X-axis direction is the direction from the vibrating section 110 toward the driven section 220, and a −X-axis direction is the direction opposite the +X-axis direction. Simple reference to the X-axis direction includes both the +X-axis direction and the −X-axis direction. The thickness direction of the piezoelectric vibrator 100, which intersects the X-axis direction, is called a "Y-axis direction." A +Y-axis direction is the direction from the piezoelectric driving apparatus 400 toward the axis of rotation O of the driven section 220, and a −Y-axis direction is the direction opposite the +Y-axis direction. Simple reference to the Y-axis direction includes both the +Y-axis direction and the −Y-axis direction. The width direction of the vibrating section 110, which intersects the X-axis direction and the Y-axis direction is called a "Z-axis direction." A +Z-axis direction is a leftward direction when viewed from the side facing the axis of rotation O of the driven section 220 in FIG. 1, and a −Z-axis direction is the direction opposite the +Z-axis direction. Simple reference to the Z-axis direction includes both the +Z-axis direction and the −Z-axis direction. In the present embodiment, the X-axis direction, the Y-axis direction, and the Z-axis direction are perpendicular to one another.

The piezoelectric vibrator 100 includes a plurality of piezoelectric vibration modules 140 layered on each other in the Y-axis direction. In the example shown in FIG. 1, the number of piezoelectric vibration modules 140 is three. The plurality of piezoelectric vibration modules 140 are bonded to each other via an electrically insulating bonding member, such as an adhesive. It is, however, noted that the piezoelectric vibrator 100 may be formed of one piezoelectric vibration module 140.

The plurality of piezoelectric vibration modules 140 are coupled to the controller 300. The controller 300 includes a drive signal generator 310 and a vibration detector 320. The drive signal generator 310 has the function of supplying piezoelectric devices provided in the piezoelectric vibrator 100 with drive signals that are each an AC signal. The vibration detector 320 has the function of acquiring a pickup signal PU, which represents the vibration of the piezoelectric vibrator 100, from a pickup electrode provided in the piezoelectric vibrator 100 and determining from the pickup signal PU pickup voltage representing the amplitude of the vibration carried by the pickup signal. The drive signal generator 310 adjusts the frequency of the drive signals in accordance with the pickup voltage detected by the vibration detector 320 and the phase difference between the drive signals and the pickup signal. The frequency of the drive signals is hereinafter also simply called a "drive frequency." The pickup signal PU is also called a vibration detection signal.

The controller 300 further has the function of controlling the drive frequency in such a way that the pickup voltage is fixed in a first frequency range and controlling the drive frequency in such a way that the pickup voltage is fixed while maintaining the phase difference between the drive signals and the pickup signal smaller than or equal to a prespecified value in a second frequency range by using the drive signal generator 310 and the vibration detector 320. The function will be described later in detail. The above-mentioned function of the controller 300 may be achieved by a circuit, or part or entirety of the function may be achieved by means of software by causing a CPU provided in the controller 300 to execute a program stored in a memory.

Figure 2:
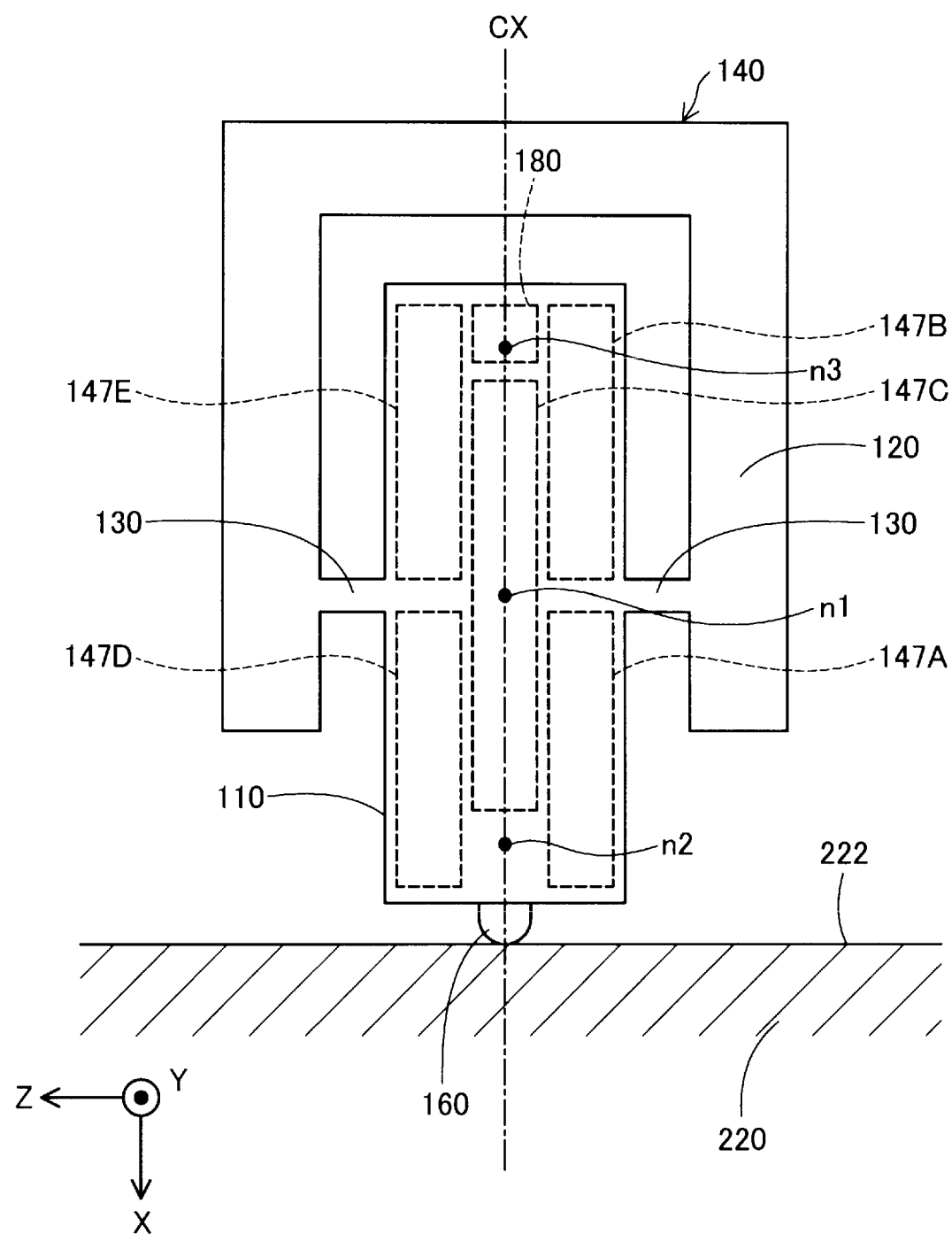
FIG. 2 is a plan view showing an example of a piezoelectric vibration module.

FIG. 2 is a plan view showing an example of each of the piezoelectric vibration modules 140. The vibrating section 110 of each of the piezoelectric vibration modules 140 includes five piezoelectric devices 147A to 147E. The pair of piezoelectric devices 147A and 147E, which are located on a diagonal of the vibrating section 110, which has a rectangular shape, simultaneously contract in the X-axis direction to cause the vibrating section 110 to produce bending vibration. The other pair of piezoelectric devices 147B and 147D, which are located on the other diagonal of the vibrating section 110, also simultaneously contract in the X-axis direction to cause the vibrating section 110 to produce bending vibration. The contraction of the pair of piezoelectric devices 147A and 147E and the contraction of the other pair of piezoelectric devices 147B and 147D preferably differ from each other in terms of phase by 180 degrees. The piezoelectric device 147C, which is located at the widthwise center of the piezoelectric vibrator 100, contracts in the X-axis direction to cause the vibrating section 110 to produce longitudinal vibration along the X-axis direction.

The individual piezoelectric devices 147A to 147E each include a piezoelectric element and two electrodes that sandwich the opposite surfaces of the piezoelectric element. The piezoelectric element can be made, for example, of a piezoelectric ceramic material, such as lead zirconate titanate, barium titanate, lead titanate, potassium niobite, lithium niobite, lithium tantalate, sodium tungstate, zinc oxide, barium strontium titanate, strontium bismuth tantalate, lead metaniobate, and lead scandium niobite. The piezoelectric element made of a piezoelectric ceramic material may be formed, for example, from a bulk material or by using a sol-gel method or a sputtering method. The piezoelectric element may instead be made, for example, of polyvinylidene fluoride or quartz in place of the piezoelectric ceramic materials described above.

The piezoelectric vibration modules 140 each further includes a pickup electrode 180. The pickup electrode 180 is an electrode for detecting the vibration of the piezoelectric vibrator 100 and supplies the controller 300 with the pickup signal PU. In the example shown in FIG. 2, the pickup electrode 180 is provided in above the piezoelectric device 147C, which is located at the center of the vibrating section 110. It is, however, noted that another pickup electrode 180 may be provided below the piezoelectric device 147C in addition to the pickup electrode 180 provided above the piezoelectric device 147C.

Figure 3:
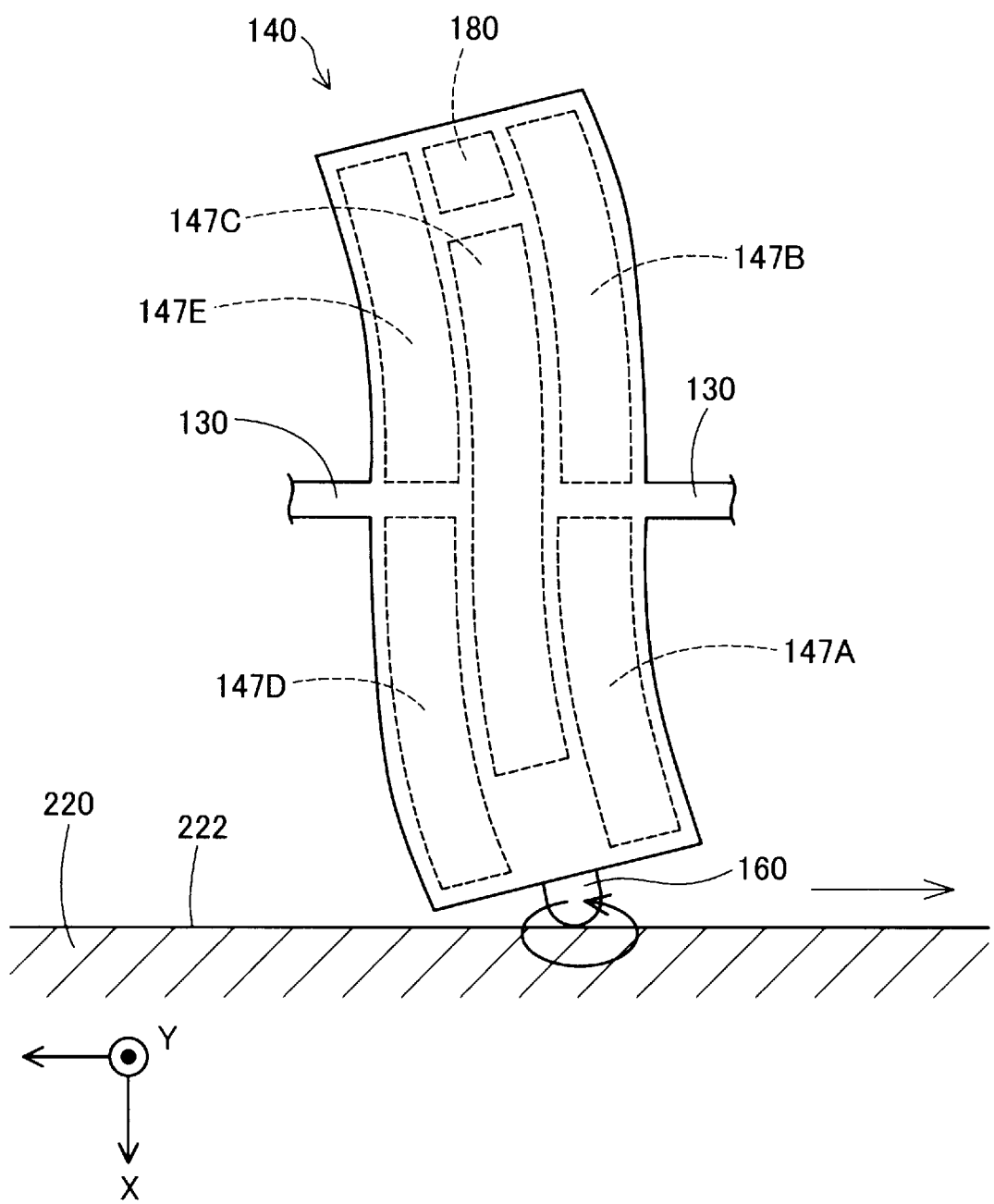
FIG. 3 is a conceptual view showing that the piezoelectric vibration modules vibrates.

FIG. 3 is a conceptual view showing that one of the piezoelectric vibration modules 140 vibrates. The piezoelectric vibration module 140 can vibrate in such a way that the contactor 160 makes elliptical motion. The elliptical motion is achieved by causing the pair of piezoelectric devices 147A and 147E to contract and the other pair of piezoelectric devices 147B and 147D to contract to produce bending vibration and causing the central piezoelectric device 147C to contract to produce longitudinal vibration. The "bending vibration" is vibration that causes the piezoelectric vibration module 140 to bend and form an S-letter-like shape in the plane of the piezoelectric vibration module 140, as shown in FIG. 3. The "longitudinal vibration" is vibration that causes the piezoelectric vibration module 140 to contract along the X-axis direction. The entire piezoelectric vibrator 100 also vibrates as the piezoelectric vibration modules 140. The four piezoelectric devices 147A, 147B, 147D, and 147E produce the bending vibration and are also called "first piezoelectric devices." The piezoelectric device 147C produces the longitudinal vibration and is also called a "second piezoelectric device." The number of first piezoelectric devices 147A, 147B, 147D, and 147E and the number of second piezoelectric devices 147C are presented by way of example, and the number of first piezoelectric devices and the number of second piezoelectric devices can each be set as appropriate at any other number. For example, the pair of first piezoelectric devices 147A and 1478 may be omitted, and the other pair of first piezoelectric devices 147D and 147E may produce the bending vibration.

Figure 4:
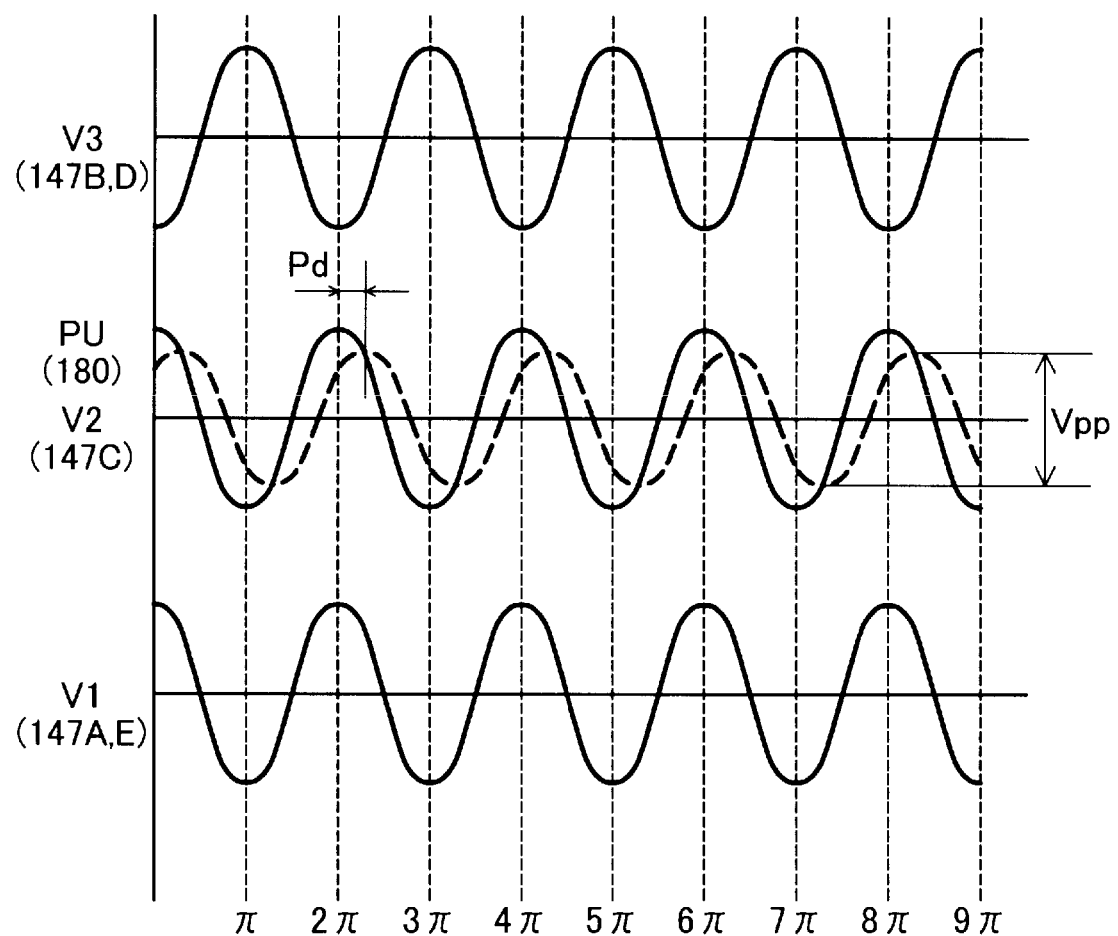
FIG. 4 shows an example of drive signals supplied to piezoelectric devices.

FIG. 4 shows an example of the drive signals supplied to the piezoelectric devices 147A to 147E. A drive signal V1 is applied to the pair of piezoelectric devices 147A and 147E. A drive signal V2 is applied to the piezoelectric device 147C. A drive signal V3 is applied to the other pair of piezoelectric devices 147B and 147D. The drive signal V3 is derived from the drive signal V1 with the phase changed by π, that is, 180 degrees and is substantially the same as the drive signal V1. The drive signals V1 and V3 are drive signals that cause the piezoelectric vibration modules 140 to produce the bending vibration and are also called "first drive signals." The drive signal V2 is a drive signal that causes the piezoelectric vibration modules 140 to produce the longitudinal vibration and is also called a "second drive signal." The frequency of the first drive signals V1 and V3 and the frequency of the second drive signal V2 are typically set at the same value.

The pickup signal PU is superimposed on the drive signal V2 shown in FIG. 4. A phase difference Pd is present between the pickup signal PU and the drive signal V2. The difference between the upper limit and the lower limit of the pickup signal PU, that is, the amplitude of the pickup signal PU is called pickup voltage Vpp. Larger pickup voltage Vpp indicates that the vibration of the piezoelectric vibrator 100 has a larger amplitude. In the present embodiment, the pickup signal PU is a signal representing the longitudinal vibration produced by the drive signal V2.

The piezoelectric vibration modules 140 each vibrate in such a way that the combination of the bending vibration and the longitudinal vibration causes the contactor 160 to make elliptical motion, as shown in FIG. 3. Causing the pair of piezoelectric devices 147A and 147E, the other pair of piezoelectric devices 147B and 147D, and the piezoelectric device 147C to contract in accordance with the drive waveforms shown in FIG. 4 as described above allows the contactor 160 to vibrate along an elliptical path. It is, however, noted that the drives signals that drive the piezoelectric vibration modules 140 do not necessarily have the waveforms shown in FIG. 4 and a variety of other waveforms can be used as long as the contactor 160 can vibrate along an elliptical path. For example, the drive signals may each have a DC component as well as the AC component. In this case, the "frequency of the drive signals" means the frequency of the AC component of the drive signals.

The pickup electrode 180 in the present embodiment is disposed in a position on a center axis CX of the piezoelectric vibrator 100, which extends along the X-axis direction, in the plan view, as shown in FIG. 2. The center axis CX coincides with the center axis of the vibrating section 110 in the plan view. When the pickup electrode 180 is disposed in a position on the center axis CX of the piezoelectric vibrator 100, the effect of the bending vibration on the pickup electrode 180 decreases, whereby the pickup electrode 180 is likely to accurately detect the longitudinal vibration. It is further preferable that the pickup electrode 180 is disposed at any of nodes n1, n2, and n3 of the bending vibration. In the example shown in FIG. 2, the node n1 of the bending vibration is present at the center of the vibrating section 110, and the other two nodes n2 and n3 are present in positions on the center axis CX in the vicinity of the ends of the vibrating section 110. When the pickup electrode 180 is disposed at any of the nodes n1, n2, and n3 of the bending vibration, the effect of the bending vibration on the pickup electrode 180 can be further reduced, whereby the pickup electrode 180 advantageously more readily detects the longitudinal vibration of the piezoelectric vibrator 100. Among the nodes n1, n2, and n3, the node n1 allows largest reduction in the effect of the bending vibration on the pickup electrode 180. Among the nodes n1, n2, and n3, the node n1 is closest to the coupling sections 130 and is unlikely to be affected by the bending vibration. It is, however, noted that the pickup electrode 180 may be disposed at a location other than the nodes.

A drive signal Vd generated by the drive signal generator 310 shown in FIG. 1 corresponds to any of the three drive signals V1 to V3 shown in FIG. 4. The controller 300 may include three drive signal generators 310 to generate the drive signals V1 to V3. Instead, the drive signal generator 310 may include a phase adjustment circuit and generate the three drive signals V1 to V3 shown in FIG. 4 from one drive signal by using the phase adjustment circuit to adjust the phase of the drive signal Vd generated by the drive signal generator 310. The action of the piezoelectric driving apparatus 400 will be described below on the assumption that the drive signal V2 applied to the piezoelectric device 147C is the drive signal Vd, which is representative of the drive signals generated by the drive signal generator 310.

Figure 5:
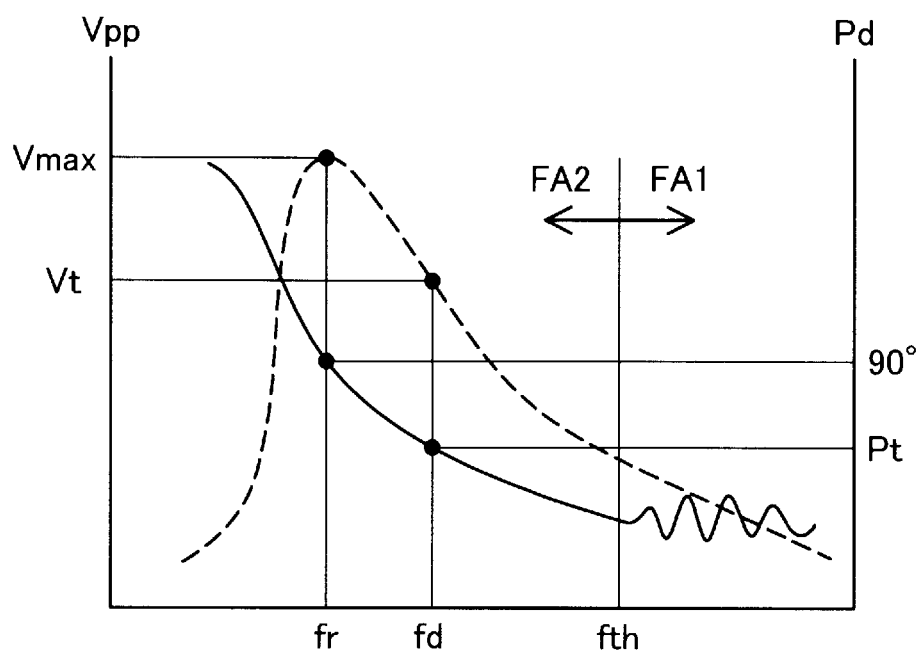
FIG. 5 shows graphs illustrating the characteristics of the action of the piezoelectric driving apparatus.

FIG. 5 shows graphs illustrating the characteristics of the action of the piezoelectric driving apparatus 400 in the first embodiment. The horizontal axis represents the frequency at which the piezoelectric vibrator 100 is driven and shows that the drive frequency increases in the rightward direction. A first vertical axis shown in a left portion of FIG. 5 represents the pickup voltage Vpp. A second vertical axis shown in a right portion of FIG. 5 represents the phase difference Pd between the drive signal V2 and the pickup signal PU. The first vertical axis shows that the pickup voltage Vpp increases in the upward direction. The second vertical axis shows that the phase difference Pd increases in the upward direction. In FIG. 5, the broken-line graph represents the characteristics of the pickup voltage Vpp, and the solid-line graph represents the characteristics of the phase difference Pd.

In the state in which the piezoelectric vibrator 100 is driven, the pickup voltage Vpp is maximized at a resonance frequency fr of the piezoelectric vibrator 100. That is, the amplitude of the vibration of the piezoelectric vibrator 100 is maximized by causing a drive frequency fd to match with the resonance frequency fr of the piezoelectric vibrator 100. When the drive frequency fd coincides with the resonance frequency fr, the phase difference Pd is about 90°. When the drive frequency fd is lower than the resonance frequency fr, the pickup voltage Vpp abruptly decreases. That is, when the drive frequency fd is set at a value smaller than the resonance frequency fr, the amplitude of the vibration of the piezoelectric vibrator 100 becomes extremely small, and it is likely to be difficult to drive the driven section 220. The controller 300 therefore preferably causes the piezoelectric vibrator 100 to vibrate by setting the drive frequency fd at a frequency that is higher than the resonance frequency fr and can provide a desired vibration amplitude.

The piezoelectric vibrator 100 in the present embodiment has a first frequency region FA1, where the phase difference Pd does not monotonously change in accordance with the frequency, and a second frequency region FA2, where the phase difference Pd monotonously changes in accordance with the frequency, as shown in FIG. 5. The sentence "the phase difference Pd does not monotonously change in accordance with the frequency" means that the phase difference Pd irregularly increases or decreases irrespective of a change in the drive signal Vd, particularly, a change in the drive signal V2 and a change in the frequency or means that the phase difference Pd cannot be detected. The sentence "the phase difference Pd monotonously changes in accordance with the frequency" refers in the present embodiment to the state in which the lower the frequency is, the more monotonously the phase difference Pd increases toward 180°. The monotonous change means that the phase difference Pd acquired at prespecified intervals only needs to monotonously change in accordance with the operating frequency of the controller 300, and that the phase difference Pd may slightly vary at intervals narrower than the prespecified intervals. In the present embodiment, the first frequency region FA1 is a region where the frequency is higher than that in the second frequency region FA2. When the frequency is high, the amplitude of the vibration of the piezoelectric vibrator 100 decreases, so that the reaction force from the driven section 220 is likely to affect the vibration of the piezoelectric vibrator 100. It is therefore believed that the phase difference Pd does not monotonously change but irregularly changes in the first frequency region FA1, where the frequency is high. A threshold fth, which corresponds to the boundary between the first frequency region FA1 and the second frequency region FA2 is, for example, 500 kHz. The threshold fth is variable depending on the structures, dimensions, and materials of the piezoelectric vibrator 100 and the driven section 220.

Figure 6:
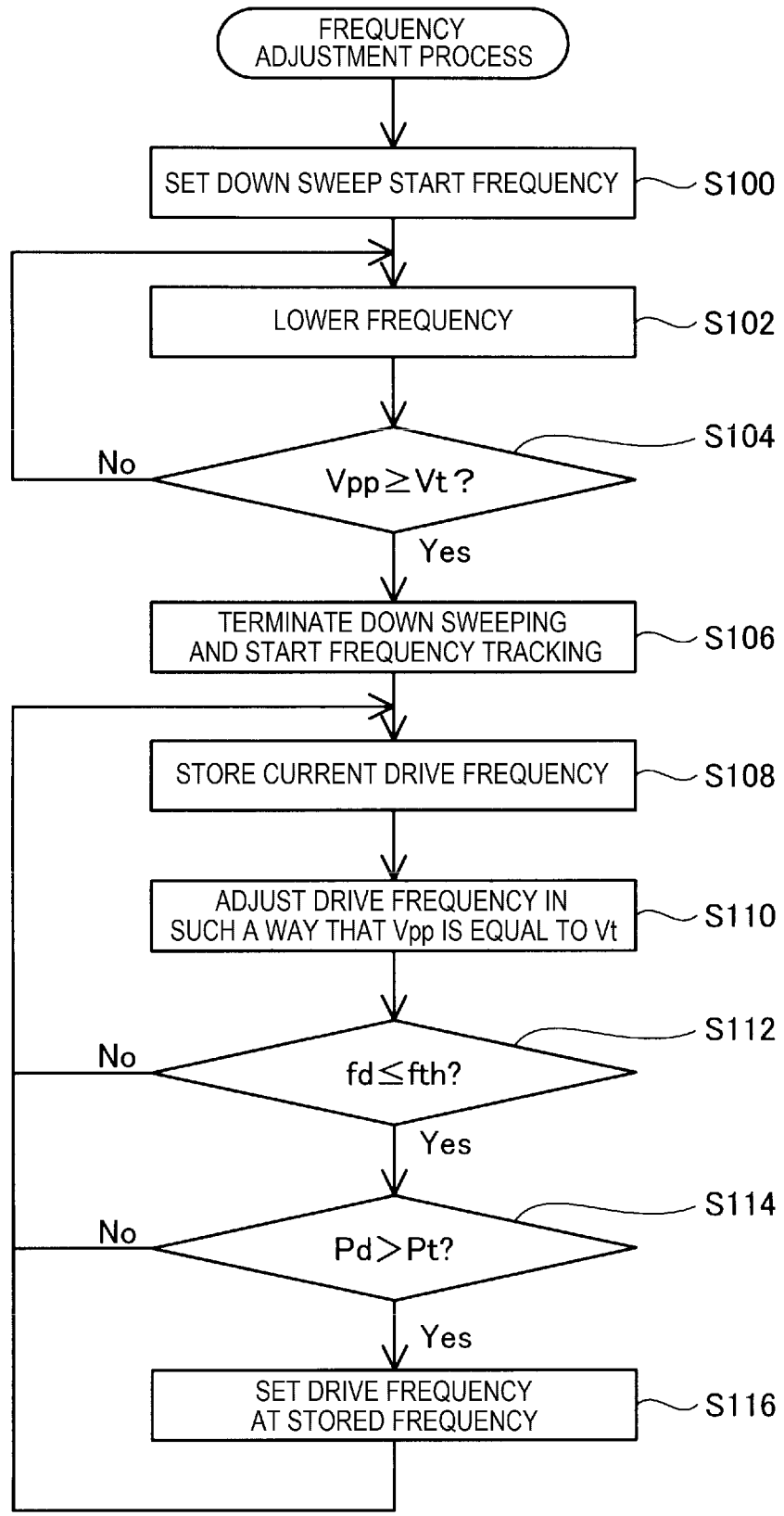
FIG. 6 is a flowchart of a frequency adjustment process.

FIG. 6 is a flowchart of a frequency adjustment process carried out by the controller 300. The flowchart shows a method for controlling the piezoelectric driving apparatus 400. The frequency adjustment process starts at the timing when the piezoelectric driving apparatus 400 is powered on.

In step S100, the controller 300 sets a start frequency at which down sweep control is performed. The down sweep control is control for determining the frequency at which the piezoelectric vibrator 100 is so driven as to vibrate at a desired amplitude while the frequency is caused to decrease from a high frequency. It is assumed in the present embodiment that the start frequency of the down sweep control is sufficiently higher than the resonance frequency fr of the piezoelectric vibrator 100 but falls within the first frequency region FA1.

In step S102, the controller 300 lowers the drive frequency of the piezoelectric vibrator 100 by one step. The one step by which the drive frequency is lowered may correspond to an arbitrary frequency width that is appropriately set. In step S104, the controller 300 evaluates whether or not the pickup voltage Vpp has become greater than or equal to target voltage Vt. The target voltage Vt is a value that allows the piezoelectric vibrator 100 to be driven at a desired vibration amplitude and can be specified in advance by performing an experiment or a simulation.

When the result of the evaluation in step S104 shows that the pickup voltage Vpp has not reached the target voltage Vt, the controller 300 returns to the process in step S102, where the controller 300 lowers the drive frequency again. The processes in steps S102 and S104 are preferably carried out whenever one cycle of the drive signal V2 elapses.

When the result of the evaluation in step S104 shows that the pickup voltage Vpp has become greater than or equal to the target voltage Vt, the controller 300 terminates the down sweep control, drives the piezoelectric vibrator 100 at the drive frequency fd set that point of time, and starts frequency tracking. The frequency tracking is the process of controlling the drive frequency fd in such a way that the pickup voltage Vpp is maintained at the target voltage Vt. The processes in step S108 and the following steps, which will be described below, correspond to the frequency tracking.

In the frequency tracking, the controller 300 first temporarily stores the current drive frequency fd in step S108. Thereafter, in step S110, the controller 300 adjusts the drive frequency fd in such a way that the pickup voltage Vpp is fixed, more specifically, the pickup voltage Vpp is equal to the target voltage Vt. In the present embodiment, the controller 300 adjusts the drive frequency fd by performing feedback control, such as PID control, in such a way that the pickup voltage Vpp is equal to the target voltage Vt.

In step S112, the controller 300 evaluates whether or not the drive frequency fd adjusted in step S110 is smaller than or equal to the threshold fth. That is, the controller 300 evaluates whether or not the current drive frequency fd falls within the second frequency region FA2. When the drive frequency fd is greater than the threshold fth, that is, when the drive frequency fd does not fall within the second frequency region FA2 but falls within the first frequency region FA1, the controller 300 returns to the process in step S108, where the controller 300 keeps performing the feedback control on the drive frequency fd. That is, when the drive frequency fd falls within the first frequency region FA1, the controller 300 controls the drive frequency fd in such a way that the pickup voltage Vpp is fixed.

When the result of the evaluation in step S112 shows that the drive frequency fd is smaller than or equal to the threshold fth, that is, when the drive frequency fd falls within the second frequency region FA2, the controller 300 further evaluates in step S114 whether or not the current phase difference Pd is greater than a target phase difference Pt, which is a prespecified value. In the present embodiment, the target phase difference Pt is a value smaller than or equal to 90°, for example, a value appropriately so set as to fall within a range from 40° to 70°. The target phase difference Pt is a phase difference that allows the piezoelectric vibrator 100 to be driven at a desired vibration amplitude and can be specified in advance by performing an experiment or a simulation.

When the result of the evaluation in step S114 shows that the current phase difference Pd is smaller than or equal to the target phase difference Pt, the controller 300 returns to the process in step S108, where the controller 300 repeats the processes in steps S108 to S112 described above. In contrast, when the result of the evaluation in step S114 shows that the current phase difference Pd is greater than the target phase difference Pt, the controller 300 reads in step S116 the drive frequency stored in step S108 and sets the drive frequency fd at the read value. That is, when the drive frequency fd falls within the second frequency region FA2, the controller 300 controls the drive frequency fd in such a way that the pickup voltage Vpp is fixed while maintaining the phase difference Pd to be smaller than or equal to the target phase difference Pt.

According to the method for controlling the piezoelectric driving apparatus 400 in the first embodiment described above, the drive frequency fd is so controlled that the pickup voltage Vpp is fixed when the drive frequency fd falls within the first frequency region FA1, and the drive frequency fd is so controlled that the pickup voltage Vpp is fixed while the phase difference Pd is maintained to be smaller than or equal to the target phase difference Pt when the drive frequency fd falls within the second frequency region FA2. Therefore, in the first frequency region FA1, where the phase difference Pd does not monotonously change, the frequency of the drive signal V1 can be so controlled without use of the phase difference Pd that the pickup voltage Vpp is fixed, whereby the drive frequency fd can be appropriately controlled even when a stable phase difference Pd is not provided due, for example, to the reaction force from the driven section 220. Further, in the second frequency region FA2, where the phase difference Pd monotonously changes, the drive frequency fd can be adjusted based not only on the pickup voltage Vpp but on the phase difference Pd, and the phase difference Pd can therefore be increased to a value greater than a prespecified value, whereby a decrease in the amplitude of the vibration of the piezoelectric vibrator 100 can be suppressed. The action of the piezoelectric driving apparatus 400 can thus be satisfactorily controlled. The phase difference Pd that causes a decrease in the amplitude of the vibration of the piezoelectric vibrator 100 is substantially fixed irrespective of the temperature of the piezoelectric vibrator 100 and other factors. In contrast, the pickup voltage Vpp is likely to vary in accordance with the temperature of the piezoelectric vibrator 100 and the surrounding environment. Controlling the drive frequency fd by using the phase difference Pd in the second frequency region FA2 therefore allows an appropriate action of the piezoelectric driving apparatus 400, as compared with the case where the drive frequency fd is controlled by using only the pickup voltage Vpp. Further, since the drive frequency fd is controlled based on the pickup voltage Vpp in the first frequency region FA1, the drive frequency fd can be controlled at higher speed than in the control performed in the second frequency region FA2, where the drive frequency fd is controlled based on the phase difference Pd and the pickup voltage Vpp.

In the present embodiment, since the first frequency region FA1 is a region where the frequency is higher than that in the second frequency region FA2, the drive frequency can be so controlled in the high-frequency region that the amplitude of the pickup voltage Vpp is fixed.

In the present embodiment, the piezoelectric vibrator 100 undergoes the longitudinal vibration and the bending vibration to drive the driven section 220, and the pickup signal PU is a signal representing the longitudinal vibration out of the vibration modes of the piezoelectric vibrator 100. The amplitude of the vibration of the piezoelectric vibrator 100 can therefore be precisely controlled.

B. Second Embodiment

Figure 7:
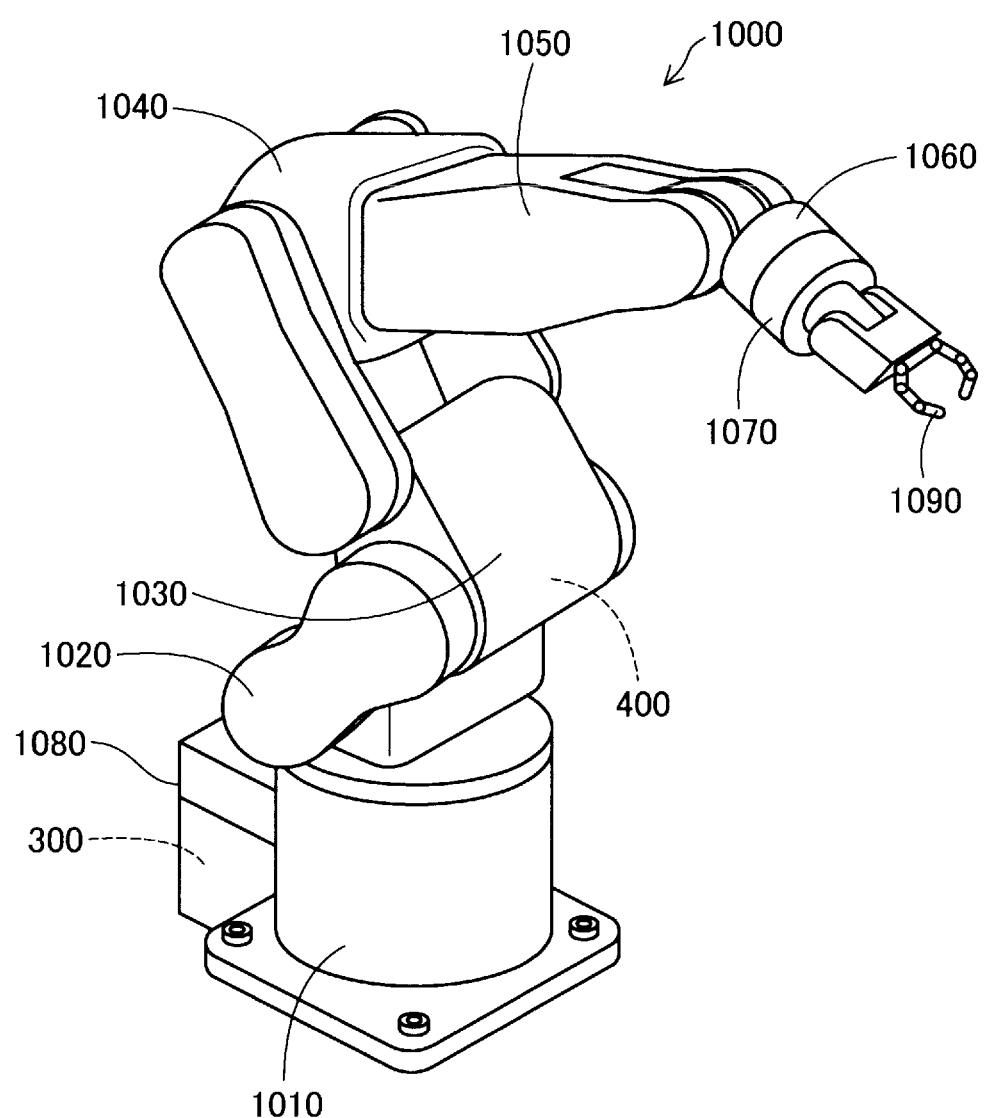
FIG. 7 is a perspective view showing a robot according to a second embodiment.

FIG. 7 is a perspective view showing a robot 1000 according to a second embodiment. The robot 1000 is a six-axis robot and includes a base 1010, which is fixed to a floor or a ceiling, arms 1020, 1030, 1040, 1050, 1060, and 1070, which are pivotably linked to the base 1010, and a robot controller 1080, which controls the operation of driving the arms 1020, 1030, 1040, 1050, 1060, and 1070. The robot controller 1080 includes the controller 300. The arm 1070 is provided with a hand coupling section, and an end effector 1090 according to work to be performed by the robot 1000 is attached to the hand coupling section.

A piezoelectric driver 400 is incorporated in all or part of the joints that link the arms to each other. The piezoelectric driver 400 causes the arms 1020, 1030, 1040, 1050, 1060, and 1070 to pivot. The operation of driving the piezoelectric driver 400 is controlled by the robot controller 1080. The piezoelectric driver 400 may be incorporated in the end effector 1090 and used to drive the end effector 1090. The robot 1000 is not limited to a vertically articulated robot, such as a six-axis robot, but may be a horizontally articulated robot.

C. Other Embodiments (C-1). In the embodiments described above, the target phase difference Pt is so set as to range from 40° to 70°. In contrast, the target phase difference Pt may be 90°. When the target phase difference Pt is 90°, the amplitude of the vibration of the piezoelectric vibrator 100 can be increased.

(C-2). In the embodiments described above, the controller 300 may carry out the process of determining the frequency range of the first frequency region FA1 and the frequency range of the second frequency region FA2 before carrying out the frequency adjustment process shown in FIG. 6. Specifically, the controller 300 gradually lowers the drive frequency at which the piezoelectric vibrator 100 is driven from a high frequency. When detecting that the phase difference Pd monotonously changes for a certain period, the controller 300 can set the drive frequency immediately before the monotonous change starts as the threshold fth, identify the frequency region after the set drive frequency as the second frequency region FA2, and identify the frequency region before the set drive frequency as the first frequency region FA1.

(C-3). In the embodiments described above, the controller 300 may carry out the process of setting the target phase difference Pt before or while carrying out the frequency adjustment process shown in FIG. 6. For example, in the down sweep control, in which the controller 300 gradually lowers the drive frequency fd, the controller 300 may determine the phase difference Pd that causes the pickup voltage Vpp to start decreasing and set the phase difference Pd or the phase difference Pd from which a fixed value is subtracted as the target phase difference Pt.

(C-4). In the embodiments described above, the first frequency region FA1 and the second frequency region FA2 are regions continuous with each other with the threshold fth being the boundary therebetween. The first frequency region FA1 and the second frequency region FA2 are not necessarily regions continuous with each other but may be regions discontinuous with each other. For example, a frequency region where the phase difference does not change or a frequency region where no phase difference is detected may be present between the first frequency region FA1 and the second frequency region FA2. In the embodiments described above, the frequency is lower in the second frequency region FA2 than in first frequency region FA1. Instead, the frequency may be lower in the first frequency region than in FA1 second frequency region FA2 depending on the characteristics of the piezoelectric vibrator 100.

(C-5). In the embodiments described above, the processes in steps S100 to S104 shown in FIG. 6 may be omitted. That is, the frequency at which the frequency tracking starts may not be determined by the down sweep control but may be specified in advance.

D. Other Aspects

The present disclosure is not limited to the embodiments described above and can be achieved in a variety of configurations to the extent that they do not depart from the substance of the present disclosure. For example, the technical features described in the embodiments and corresponding to the technical features in the aspects described below can be replaced with other features or combined with each other as appropriate to solve part or entirety of the problems described above or achieve part or entirety of the effects described above. When any of the technical features has not been described as an essential feature in the present specification, the technical feature can be deleted as appropriate.

(1) According to a first aspect of the present disclosure, a method for controlling a piezoelectric driving apparatus including a piezoelectric vibrator is provided. The piezoelectric vibrator described above has a first frequency region where the phase difference between a pickup signal representing the vibration of the piezoelectric vibrator described above and a drive signal that drives the piezoelectric vibrator described above does not monotonously change in accordance with the frequency of the drive signal described above and a second frequency region where the phase difference described above monotonously changes in accordance with the frequency of the drive signal described above, and the control method described above controls the frequency of the drive signal described above in such a way that pickup voltage representing the amplitude of the pickup signal described above is fixed in the first frequency region described above and controls the frequency of the drive signal described above in such a way the pickup voltage described above is fixed with the phase difference described above maintained smaller than or equal to a prespecified value in the second frequency region described above.

According to the aspect described above, in the first frequency region, where the phase difference between the pickup signal representing the vibration of the piezoelectric vibrator and the drive signal that drives the piezoelectric vibrator does not monotonously change, the frequency of the drive signal is so controlled without use of the phase difference that the pickup voltage is fixed, whereby the drive frequency can be appropriately controlled even when a stable phase difference is not provided in the first frequency region. In the second frequency region, where the phase difference monotonously changes, the drive frequency can be adjusted based on the phase difference and the pickup voltage, whereby the action of the piezoelectric driving apparatus can be satisfactorily controlled. Since the frequency of the drive signal is controlled based on the pickup voltage in the first frequency region, as described above, the frequency of the drive signal can be controlled at higher speed than in the control performed in the second frequency region, where the frequency of the drive signal is controlled based on the phase difference and the pickup voltage.

(2) In the method for controlling a piezoelectric driving apparatus in the aspect described above, the first frequency region described above may be a region where the frequency is higher than that in the second frequency region described above. In the aspect described above, the frequency of the drive signal can be so controlled in the high-frequency region that the amplitude of the pickup voltage is fixed.

(3) In the method for controlling a piezoelectric driving apparatus in the aspect described above, the prespecified value described above may be 90°. In the aspect described above, the amplitude of the vibration of the piezoelectric vibrator can be increased.

(4) In the method for controlling a piezoelectric driving apparatus in the aspect described above, the piezoelectric vibrator described above may undergo the longitudinal vibration and the bending vibration to drive the driven section, and the pickup signal described above may be a signal representing the longitudinal vibration described above. In the aspect described above, the amplitude of the vibration of the piezoelectric vibrator can be precisely controlled.

(5) According to a second aspect of the present disclosure, a piezoelectric driving apparatus that drives a driven section is provided. The piezoelectric driving apparatus includes a piezoelectric vibrator that drives the driven section described above and a controller. The piezoelectric vibrator described above has a first frequency region where the phase difference between a pickup signal representing the vibration of the piezoelectric vibrator described above and a drive signal that drives the piezoelectric vibrator described above does not monotonously change in accordance with the frequency of the drive signal described above and a second frequency region where the phase difference described above monotonously changes in accordance with the frequency of the drive signal described above, and the controller described above controls the frequency of the drive signal described above in such a way that pickup voltage representing the amplitude of the pickup signal described above is fixed in the first frequency region described above and controls the frequency of the drive signal described above in such a way the pickup voltage described above is fixed with the phase difference described above maintained smaller than or equal to a prespecified value in the second frequency region described above. The second aspect also provides the same effects provided by the first aspect.

(6) According to a third aspect of the present disclosure, a robot including the piezoelectric driving apparatus in the second aspect described above is provided. The third aspect also provides the same effects provided by the first aspect.

What is claimed is:

1. A method for controlling a piezoelectric driving apparatus including a piezoelectric vibrator,
   the piezoelectric vibrator having a first frequency region where a phase difference between a pickup signal representing vibration of the piezoelectric vibrator and a drive signal that drives the piezoelectric vibrator does not monotonously change in accordance with a frequency of the drive signal and a second frequency region where the phase difference monotonously changes in accordance with the frequency of the drive signal,
   the method comprising:
   controlling the frequency of the drive signal in such a way that pickup voltage representing an amplitude of the pickup signal is fixed in the first frequency region; and
   controlling the frequency of the drive signal in such a way the pickup voltage is fixed with the phase difference maintained smaller than or equal to a prespecified value in the second frequency region.

2. The method for controlling a piezoelectric driving apparatus according to claim 1,
   wherein the first frequency region is a region where the frequency is higher than the frequency in the second frequency region.

3. The method for controlling a piezoelectric driving apparatus according to claim 1,
   wherein the prespecified value is 90°.

4. The method for controlling a piezoelectric driving apparatus according to claim 1,
   wherein the piezoelectric vibrator undergoes longitudinal vibration and bending vibration to drive a driven section, and the pickup signal is a signal representing the longitudinal vibration.

5. A piezoelectric driving apparatus that drives a driven section, the apparatus comprising:
   a piezoelectric vibrator that drives the driven section; and
   a controller,
   wherein the piezoelectric vibrator has a first frequency region where a phase difference between a pickup signal representing vibration of the piezoelectric vibrator and a drive signal that drives the piezoelectric vibrator does not monotonously change in accordance with a frequency of the drive signal and a second frequency region where the phase difference monotonously changes in accordance with the frequency of the drive signal, and
   the controller
   controls the frequency of the drive signal in such a way that pickup voltage representing an amplitude of the pickup signal is fixed in the first frequency region, and
   controls the frequency of the drive signal in such a way the pickup voltage is fixed with the phase difference maintained smaller than or equal to a prespecified value in the second frequency region.

6. A robot comprising the piezoelectric driving apparatus according to claim 5.

* * * * *